(12) United States Patent
Payne

(10) Patent No.: US 9,942,066 B2
(45) Date of Patent: Apr. 10, 2018

(54) EMBEDDED CLOCK IN COMMUNICATION SYSTEM

(71) Applicant: Texas Instruments Incorporated, Dallas, TX (US)

(72) Inventor: Robert Floyd Payne, Lucas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/634,668

(22) Filed: Jun. 27, 2017

(65) Prior Publication Data

US 2017/0295045 A1    Oct. 12, 2017

Related U.S. Application Data

(63) Continuation of application No. 14/985,254, filed on Dec. 30, 2015, now Pat. No. 9,722,824.

(51) Int. Cl.
| | |
|---|---|
| *H04L 25/49* | (2006.01) |
| *H04L 7/00* | (2006.01) |
| *H04L 7/04* | (2006.01) |
| *H03M 9/00* | (2006.01) |

(52) U.S. Cl.
CPC .......... *H04L 25/4927* (2013.01); *H03M 9/00* (2013.01); *H04L 7/0087* (2013.01); *H04L 7/042* (2013.01)

(58) Field of Classification Search
USPC ............. 375/287; 714/800; 327/544; 341/50
See application file for complete search history.

(56) References Cited

U.S. PATENT DOCUMENTS

| | | | |
|---|---|---|---|
| 8,354,630 B2 * | 1/2013 | Hoshino | H03M 1/144 250/208.1 |
| 2010/0079202 A1 * | 4/2010 | Sugimoto | H03M 1/002 327/544 |
| 2012/0036417 A1 * | 2/2012 | Kehl | H03M 1/0687 714/800 |
| 2014/0002887 A1 | 1/2014 | Yeung | |
| 2014/0313065 A1 | 10/2014 | Schafferer et al. | |
| 2016/0036461 A1 * | 2/2016 | Cronie | H03M 1/18 341/50 |
| 2016/0118996 A1 | 4/2016 | Chen | |
| 2017/0170832 A1 * | 6/2017 | Isozaki | H03B 5/32 |

* cited by examiner

*Primary Examiner* — Eva Puente
(74) *Attorney, Agent, or Firm* — Michael A. Davis, Jr.; Charles A. Brill; Frank D. Cimino

(57) ABSTRACT

A method for simultaneously transmitting data bits and a clock signal includes converting the combination of the data bits and the clock signal to analog voltages by a digital-to-analog converter. The clock signal are the most significant bit of the digital-to-analog conversion and the data bits are the least significant bit of the digital-to-analog conversion.

9 Claims, 3 Drawing Sheets

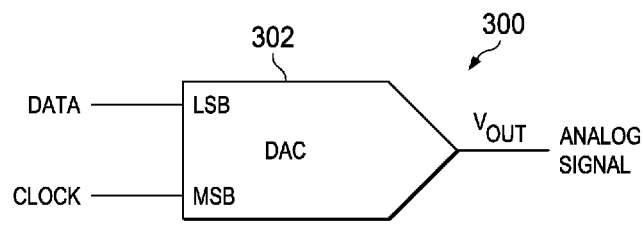
FIG. 3
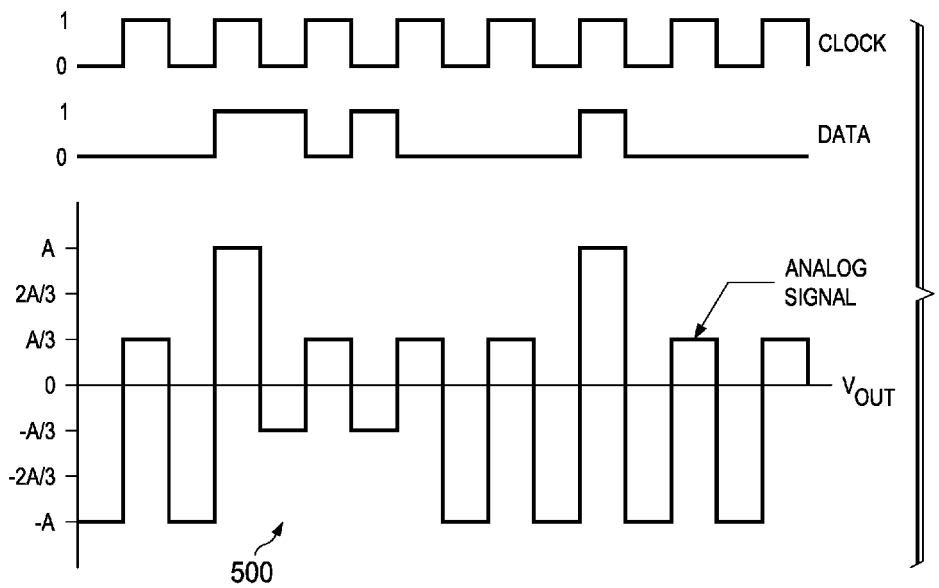
FIG. 4
FIG. 5

EMBEDDED CLOCK IN COMMUNICATION SYSTEM

CROSS-REFERENCE TO RELATED APPLICATIONS

This continuation application claims priority to U.S. patent application Ser. No. 14/985,254 filed Dec. 30, 2015, which application is incorporated herein by reference.

BACKGROUND

Processors, such as digital and mixed-signal processors require digital data communications between various processing, storage, and interface (input/output) subsystems in the processors. As the required data communication rates increase, such as to the terabit/second range, the complexity, area, and power of interface circuits between these subsystems also increases.

At a high level, two techniques are generally used for data communications. The first technique uses many parallel data lines in addition to a clock. The second technique uses serializer/deserializer (SerDes) technology. The parallel data communication technique includes a plurality of buffers for boosting the data signals. The buffers draw large dynamic currents from a power supply, which cause power supply noise due to finite impedance of the power delivery network. Therefore, the parallel communications techniques are not desirable for many high speed communications.

SerDes techniques are very complex and result in significant design effort, consumption of die area, and power. Additionally, the SerDes techniques potentially add many points of failure to the processors in which they are located. The SerDes systems are therefore typically used at the boundaries of circuits for off-die interconnects and are typically not compatible with communications in a die constituting a processor.

SUMMARY

A method for simultaneously transmitting data bits and a clock signal includes converting the combination of the data bits and the clock signal to analog voltages by a digital-to-analog converter. The clock signals are the most significant bit of the digital-to-analog conversion and the data bits are the least significant bit of the digital-to-analog conversion.

BRIEF DESCRIPTION OF THE DRAWINGS

FIG. 3 is a block diagram of an example transmitter that embeds a clock signal and a data signal into an analog signal.

FIG. 4. is a chart showing example output voltage $V_{OUT}$ levels for different inputs to the digital-to-analog converter of FIG. 3.

FIG. 5 is an example graph showing input data and clock signals to the transmitter of FIG. 3 and the resulting analog signal.

DETAILED DESCRIPTION

Processors, such as digital and mixed-signal processors, use high speed data communications to transfer data between various processing, storage, and interface (input/output) subsystems in the processors. Two techniques are generally used for data communications. The first technique uses many parallel data lines in addition to a clock signal operating on a separate data line. The second technique uses serializer/deserializer (SerDes) technology.

Figure 1:
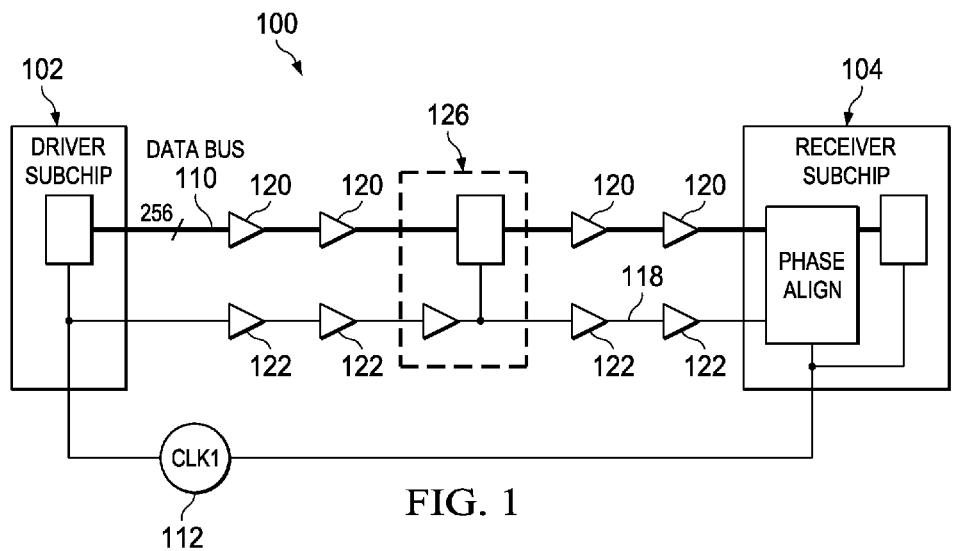
FIG. 1 is a block diagram of a parallel data communication system.

FIG. 1 is a block diagram of a parallel data communication system 100. The system 100 includes a driver subchip 102 and a receiver subchip 104 as may be implemented in a system on chip (SOC) or multi-core processor. Many of the communication techniques described with reference to FIG. 1 additionally apply to systems where data travels off a die between two chips on an integrated system in package (SIP) or between two packaged chips communicating on a system board.

A data bus 110 transmits data between the driver subchip 102 and the receiver subchip 104. In the example of FIG. 1, the data bus 110 is 256 bits wide, meaning that it contains 256 parallel wires or other conductors. A global clock 112 distributes a clock signal to both the driver subchip 102 and the receiver subchip 104. The clock signal is used to "clock out" data and provides a clock signal on a clock line 118 coupled between the driver subchip 102 and the receiver subchip 104.

When the routing distance between the driver subchip 102 and the receiver subchip 104 is large and the data rates on the data bus 110 are high, the parasitic resistance and capacitance on the interconnects between the driver subchip 102 and the receiver subchip 104 limit the bandwidth and maximum data rates. In some examples, when the routing distances are 1.0 mm to 1.5 mm and the data rates are 500 Mb/s to 1500 Mb/s, the parasitic resistance and capacitance on the interconnects between the driver subchip 102 and the receiver subchip 104 limit the bandwidth and maximum data rate on the data bus 110.

In order to improve the data rates, buffers 120 are inserted into the data bus 110 between the driver subchip 102 and the receiver subchip 104 to re-drive the data on the data bus 110. Buffers 122 also re-drive the clock signal on the clock line 118 between the driver subchip 102 and the receiver subchip 104. In some examples, the data bus 110 is re-timed as indicated by the block 126. In some systems, there may be millions of buffers 120, 122 on a single die or chip. This high number of buffers 120, 122, along with the large width of the data bus 110 consumes significant die area. The buffers 120, 122 also consume significant power, reaching over 5 W on some systems. The buffers 120, 122 are typically fabricated with CMOS inverters that have an output voltage swing between 0V and the power supply voltage for the system 100, which is typically 0.8V to 1.2V. Accordingly, the buffers 120, 122 draw large dynamic currents from the power supply, which results in supply noise due to the finite impedance of the power delivery network. Therefore, the use of the buffers 120, 122 is not desirable for high speed data busses.

Figure 2:
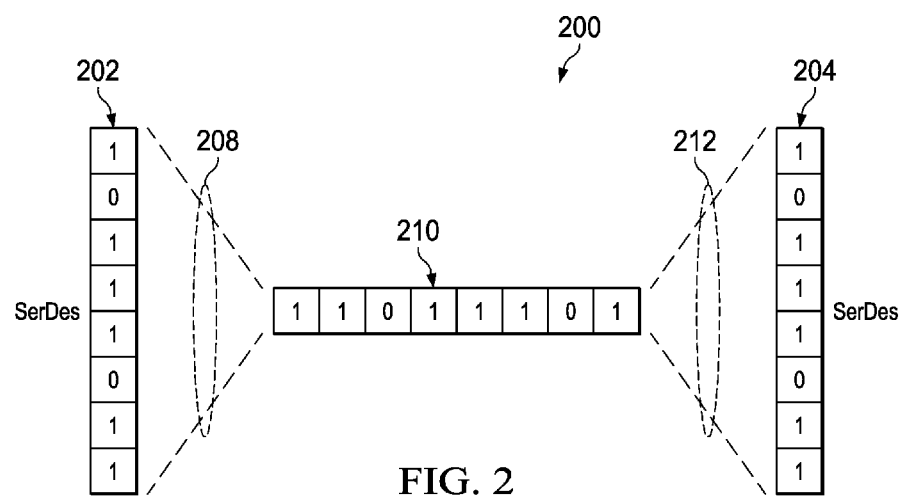
FIG. 2 is a block diagram of a communication system using serializer/deserializer (SerDes) technology.

FIG. 2 is a block diagram of a communication system 200 using serializer/deserializer (SerDes) technology. The system 200 increases data rates by combining multiple streams of lower speed parallel data into single higher speed serial data streams. The system 200 includes a driver subchip 202 and a receiver subchip 204 that output and input parallel data, respectively. In the example of FIG. 2, the parallel data has eight bits or channels. The parallel data generated by the driver subchip 202 is serialized into serial data by a serializer 208. The serial data is transmitted to the receiver subchip 204 by a high speed serial data line 210. The serial data line 210 has to operate at the number of parallel channels faster than the data rate of the parallel channel. The serial data is deserialized to parallel data by a deserializer 212 for processing by the receiver subchip 204.

Some examples of SerDes system components include clock generation and recovery circuits, data line drivers, test circuits, receivers, and other devices. These SerDes systems are very complex compared to the parallel communication systems. The complexity of SerDes systems results in significant design effort, consumption of die area and power, and potentially adds many points of failure in the system 200. These systems are therefore typically used at the boundaries of chips for off-die interconnects and are rarely used in on-die communication.

The circuits and methods described herein eliminate the receiver SerDes functions and embed the clock signal in the data stream. Conventional SerDes systems use a non-return-to-zero (NRZ) signaling scheme where the data signal is represented by two binary levels. At the receiver, a clock recovery circuit (CDR) examines the incoming data signal and locks a clock signal onto the transitions embedded in the incoming data signal. This CDR consumes significant die area and design effort, is prone to false lock, and has a finite clock tracking bandwidth. Furthermore, the CDR performance is limited by jitter between the recovered clock signal and the incoming data signal. Accordingly, the NRZ signaling scheme requires significant die area, adds latency to the system, and has inefficiencies. For example, one popular encoding technique is 8B10B signaling, where 8 bits of data are encoded into a 10 bit data word. This coding technique guarantees a certain transition density and ensures DC balanced signals, but as the name implies, it carries a 25% overhead (10/8=1.25).

The circuits and methods described herein overcome the above-described problems by embedding a clock signal and data signal into a single analog signal. FIG. 3 is a block diagram of an example transmitter 300 that embeds a digital clock signal CLOCK and a digital data signal DATA into an analog signal. The transmitter 300 includes a digital-to-analog converter (DAC) 302 that converts digital signals to voltages or analog signals. In the example of FIG. 3, the DAC 302 converts two bits of digital data to four discrete voltage levels, referred to as $V_{OUT}$, which is the analog signal output by the DAC 302.

As shown in FIG. 3, the DAC 302 has an input for the most significant bit (MSB) and an input for the least significant bit (LSB). The clock signal is coupled to the MSB input and the data signal is coupled to the LSB input, but they may be switched in other examples. The example DAC 302 outputs normalized voltages between a value of −A and +A. The value of −A is sometimes referred to as the minimum negative value and the value of +A is sometimes referred to as the maximum positive value. When the MSB, which is coupled to the clock signal, is logic zero, the voltage output by the DAC 302 is negative, and when the MSB or clock signal is logic one, the voltage output by the DAC 302 is positive. The actual value of the positive or negative output voltage indicates whether the data signal is logic one or logic zero as described below.

FIG. 4 is a chart 400 showing example output voltage $V_{OUT}$ levels for different inputs or logic states to the DAC 302. The four exemplary discrete voltage levels generated by the DAC 302 are −A, −A/3, +A/3, and +A. Other DACs may generate different discrete output voltages $V_{OUT}$ than those described herein. Accordingly, the transmitter 300 and methods described herein may operate in the same manner based on different output voltages $V_{OUT}$ generated by the DAC 302. As described above, the clock signal is coupled to the MSB input to the DAC 302, so it determines the polarity of the output voltage $V_{OUT}$. In the example of FIG. 4, the clock signal being in a state of logic one causes the output voltage $V_{OUT}$ to be positive. Likewise, when the clock signal is in a logic zero state, the output voltage $V_{OUT}$ is negative. When the data signal is logic zero, the output voltage $V_{OUT}$ is −A when the clock signal is logic zero and +A/3 when the clock signal is logic one. When the data signal is logic one, the output voltage $V_{OUT}$ is −A/3 when the clock signal is logic zero and +A when the clock signal is logic one.

FIG. 5 is an example graph 500 showing an input data signal and clock signal to the transmitter 300 of FIG. 3 and the resulting analog signal. As shown in by the graph 500, the analog signal varies between +A, +A/3, −A/3, and −A in response to the clock signals and data signals. More specifically, the output voltage $V_{OUT}$ follows the values of the chart 400 of FIG. 4 in response to the clock signals and the data signals.

Figure 6:
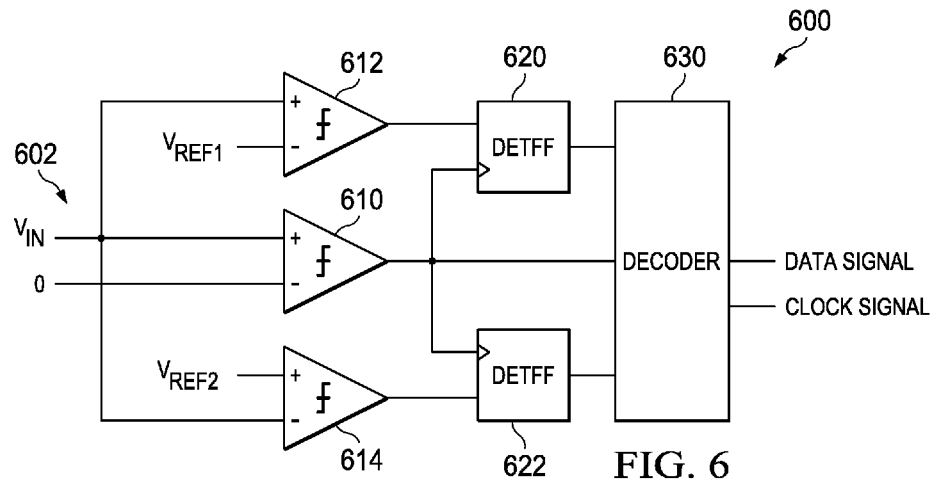
FIG. 6 is a block diagram of an example receiver that decodes the analog signal generated by the transmitter of FIG. 3.

FIG. 6 is a block diagram of an example receiver 600 that decodes the analog signal generated by the transmitter 300 of FIG. 3. More specifically, the receiver 600 regenerates the clock signal and data signal previously input to the transmitter 300. The receiver 600 has an input 602 that receives an input signal $V_{IN}$, which is the analog signal generated by the transmitter 300. The input 602 is coupled to a first comparator 610, a second comparator 612, and a third comparator 614. The first comparator 610 extracts the clock signal from input signal $V_{IN}$ by comparing the input signal $V_{IN}$ to a zero level. If the input voltage $V_{IN}$ is greater than zero, the clock signal is set to logic one. If the input voltage $V_{IN}$ is less than zero, the clock signal is set to logic zero. The above-described logic levels for the clock may be reversed in some examples so a positive input voltage $V_{IN}$ results in a logic zero clock signal and vice versa. In some examples, when the input voltage $V_{IN}$ transitions from a negative value to a positive value, a rising edge of logic zero to logic one is generated by the first comparator 610 for the clock signal. When the input voltage $V_{IN}$ transitions from a positive value to a negative value, a falling edge from logic one to logic zero is generated by the first comparator 610 for the clock signal. In some embodiments, the first comparator 610 compares the input voltage $V_{IN}$ to a predetermined voltage other than zero.

The second comparator 612 compares the input voltage $V_{IN}$ to a first reference voltage $V_{REF1}$, which in the example of FIG. 6 is +2A/3. The second comparator 612 serves to determine if the input voltage $V_{IN}$ is greater than +A/3, so the reference voltage $V_{REF1}$ may be other voltages that are greater than +A/3. If the output of the first comparator 610 is logic one and the output of the second comparator 612 is logic one, the data on the input signal $V_{IN}$ is interpreted as logic one. If the output of the first comparator 610 is logic one and the output of the second comparator 612 is logic zero, the data on the input signal $V_{IN}$ is interpreted as logic zero. This correlation may be reversed in other examples.

The third comparator 614 compares the input voltage $V_{IN}$ to a second reference voltage $V_{REF2}$, which in the example of FIG. 6 is −2A/3. The third comparator 614 serves to determine if the input voltage $V_{IN}$ is less than −A/3, so the reference voltage $V_{REF2}$ may be other voltages that are less than −A/3. If the output of the first comparator 610 is logic zero and the output of the third comparator 614 is logic zero, the data on the input signal $V_{IN}$ is interpreted as logic zero. If the output of the first comparator 610 is logic zero and the output of the second comparator 612 is logic one, the data on the input signal $V_{IN}$ is interpreted as logic one. This correlation may be reversed in other examples.

The outputs of the second comparator 612 and the third comparator 614 are registered by a first double-edge triggered flip-flop (DETFF) 620 and a second DETFF 622, respectively. The DETFFs 620 and 622 pass data on transitions of the clock signal. Accordingly, the decoder 630 generates one data bit of the data signal for every transition of the clock signal output by the first comparator 610. The outputs of the DETFFs 620 and 622 and the output of the first comparator 610 are input to a decoder 630 that generates a data signal and a clock signal in response to the outputs of the DETFFs 620 and 622 and the output of the first comparator 610.

Figure 7:
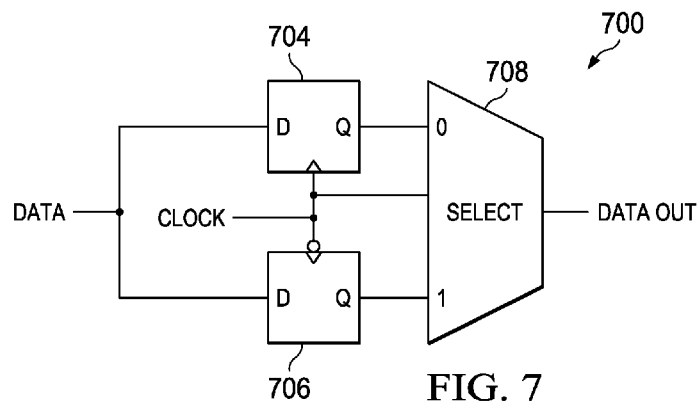
FIG. 7 is a block diagram of a double edge triggered flip-flop (DETFF) that is representative of the flip-flops of FIG. 6.

FIG. 7 is a block diagram of a DETFF 700 that is representative of the flip-flops 616 and 618 from FIG. 6. The DETFF 700 uses the clock signal operating at a frequency f to register the data at the input of the flip-flop operating at a frequency 2 f. For example, the data could operate or transfer at a rate of 2.0 G bps and the clock may operate at 1.0 GHz. The DETFF 700 includes a first D/Q flip-flop 704, a second D/Q flip-flop 706, and a multiplexor 708. The clock signal is coupled to the selection of the flip-flops 704 and 706, wherein the clock signal is inverted into the second flip-flop 706. The clock signal is also the selection input for the multiplexor 708. When the clock signal transitions high, the data at the first flip-flop 704 is passed to the output designated DATA OUT. When the clock signal transitions low, the data at the second flip-flop 706 is passed to the output designated DATA OUT. Accordingly, the data is passed on every clock signal transition.

Figure 8:
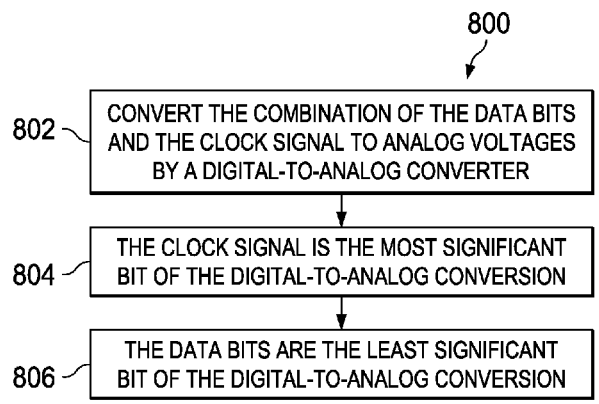
FIG. 8 is a flow chart describing a method for simultaneously transmitting data bits and a clock signal.

FIG. 8 is a flow chart 800 describing a method for simultaneously transmitting data bits and a clock signal. The method includes converting the combination of the data bits and the clock signal to analog voltages by a digital-to-analog converter at block 802. In block 804, the clock signal is the most significant bit of the digital-to-analog conversion. In block 806, the data bits are the least significant bit of the digital-to-analog conversion.

While some examples of communication systems and methods of communicating have been described in detail herein, it is to be understood that the inventive concepts may be otherwise variously embodied and employed and that the appended claims are intended to be construed to include such variations except insofar as limited by the prior art.

What is claimed is:

1. A receiver for decoding a data signal and a clock signal from an input signal having four voltage levels, the receiver comprising:
  a voltage input for receiving the input signal;
  a first comparator coupled to the voltage input for comparing the input signal to a zero voltage;
  a second comparator coupled to the voltage input for comparing the input signal to a first reference voltage;
  a third comparator coupled to the voltage input for comparing the input signal to a second reference voltage; and
  a decoder coupled to outputs of the comparators, the decoder for generating a first logic state of the data signal in response to the input signal being greater than the first reference voltage when the input signal is positive, and for generating a second logic state of the data signal in response to the input voltage being less than the second reference voltage when the input signal is negative.

2. The receiver of claim 1, wherein the input signal has a maximum positive value and wherein the first reference voltage is approximately two thirds of the maximum positive value.

3. The receiver of claim 1, wherein the input signal has a minimum negative value and wherein the second reference voltage is approximately two thirds of the minimum negative value.

4. The receiver of claim 1, wherein the decoder is further for:
  decoding a first logic state of the clock signal in response to the output of the first comparator being a first value; and
  decoding a second logic state of the clock signal in response to the output of the first comparator being a second value.

5. The receiver of claim 1, wherein the decoder is further for:
  decoding the clock signal to logic one in response to the output of the first comparator being a first value; and
  decoding the clock signal to logic zero in response to the output of the first comparator being a second value.

6. The receiver of claim 1, wherein the decoder is further for:
  generating a first logic state for the data signal in response to the input signal being greater than the first reference voltage when the input signal is positive; and
  generating a second logic for the data signal in response to the input voltage being less than the first reference voltage when the input signal is positive.

7. The receiver of claim 1, wherein the decoder is further for:
  generating a first logic state for the data signal in response to the input signal being greater than the second reference voltage when the input signal is negative; and
  generating a second logic for the data signal in response to the input voltage being less than the second reference voltage when the input signal is negative.

8. The receiver of claim 1, wherein the decoder is further for generating one bit of the data signal for every transition of the clock signal.

9. The receiver of claim 1 further comprising:
  a first double edge triggered flip-flop (DETFF) coupled between the output of the second comparator and the decoder, the first DETFF having a selection input coupled to the output of the first comparator; and
  a second DETFF coupled between the output of the third comparator and the decoder, the second DETFF having a selection input coupled to the output of the first comparator.

* * * * *